US012477654B2

(12) United States Patent
Achiriloaie

(10) Patent No.: US 12,477,654 B2
(45) Date of Patent: Nov. 18, 2025

(54) RF POWER PALLET WITH MANAGEMENT DAUGHTER BOARD

(71) Applicant: MACOM Technology Solutions Holdings, Inc., Lowell, MA (US)

(72) Inventor: Benone Achiriloaie, Riverside, CA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 545 days.

(21) Appl. No.: 17/711,509

(22) Filed: Apr. 1, 2022

(65) Prior Publication Data

US 2023/0319995 A1 Oct. 5, 2023

(51) Int. Cl.
*H05K 1/14* (2006.01)
*H01R 12/72* (2011.01)
*H05K 1/02* (2006.01)

(52) U.S. Cl.
CPC .......... *H05K 1/144* (2013.01); *H01R 12/721* (2013.01); *H05K 1/024* (2013.01); *H05K 1/141* (2013.01); *H05K 2201/10098* (2013.01)

(58) Field of Classification Search
CPC ........ H05K 1/144; H05K 1/024; H05K 1/141; H01R 12/721
See application file for complete search history.

(56) References Cited

U.S. PATENT DOCUMENTS

| 5,835,352 A  * | 11/1998 | Matsuzaki ........... H05K 5/0091 |
| | | 257/E23.101 |
| 6,377,464 B1 | 4/2002 | Hashemi et al. |
| 6,609,915 B2 | 8/2003 | Scott et al. |
| 6,818,977 B2 | 11/2004 | Poo et al. |
| 7,258,549 B2 | 8/2007 | Asahi et al. |
| 7,679,179 B2 | 3/2010 | Jeung et al. |
| 7,983,624 B2 | 7/2011 | Knecht et al. |
| 8,148,806 B2 | 4/2012 | Lin et al. |
| 9,041,176 B2 | 5/2015 | Li et al. |
| 10,477,633 B1 * | 11/2019 | Hu ....................... H05B 47/183 |
| 11,916,325 B1 * | 2/2024 | Balasubramanian .. H01R 12/75 |
| 2003/0076660 A1 * | 4/2003 | Horie ................... H05K 3/0052 |
| | | 333/33 |

(Continued)

FOREIGN PATENT DOCUMENTS

EP 0491161 A1 6/1992

*Primary Examiner* — Nathan W Ha
(74) *Attorney, Agent, or Firm* — Perilla Knox & Hildebrandt LLP; Jason M. Perilla

(57) ABSTRACT

Radio frequency (RF) power pallets including primary or first circuit boards and daughter or second circuit boards are described. An example RF power pallet includes a first circuit board comprising a first side, a second side, a first metal layer, and a second metal layer. The power pallet also includes an RF power amplifier coupled to the first metal layer and a second circuit board electrically coupled to the first metal layer. The second circuit board includes a bias voltage driver for the RF power amplifier, and the first metal layer includes a bias voltage trace that extends from a contact of the second circuit board to a gate of the power amplifier. The second circuit board extends the features of the RF pallet, while avoiding some increases in size, costs, and complexity that would typically be associated with the new features.

20 Claims, 4 Drawing Sheets

(56) References Cited

U.S. PATENT DOCUMENTS

| | | |
|---|---|---|
| 2003/0143971 A1 | 7/2003 | Hongo et al. |
| 2006/0000638 A1 | 1/2006 | Levine et al. |
| 2006/0081065 A1* | 4/2006 | Heipp ............... H05K 1/144 |
| | | 73/856 |
| 2006/0290421 A1* | 12/2006 | Ichitsubo ............... H05K 1/144 |
| | | 257/E25.031 |
| 2007/0291180 A1* | 12/2007 | Takatori ............. H04N 21/4181 |
| | | 348/E5.003 |
| 2009/0256252 A1* | 10/2009 | Liu ..................... H01L 23/5385 |
| | | 257/E21.511 |
| 2010/0020580 A1* | 1/2010 | Kim ....................... H05K 1/144 |
| | | 363/125 |
| 2011/0158344 A1* | 6/2011 | Kawamura ............. H01P 5/028 |
| | | 375/295 |
| 2012/0201008 A1* | 8/2012 | Hershberger .......... H10N 10/13 |
| | | 361/720 |
| 2013/0114218 A1* | 5/2013 | Itagaki ................... H05K 1/025 |
| | | 361/748 |
| 2013/0203274 A1 | 8/2013 | Kraft et al. |
| 2014/0077809 A1* | 3/2014 | Schmidt ............. G01R 33/5619 |
| | | 324/309 |
| 2016/0372849 A1* | 12/2016 | Hsiao ..................... H05K 1/141 |
| 2017/0019998 A1 | 1/2017 | Franco |
| 2019/0215964 A1* | 7/2019 | Long ....................... H05K 3/34 |
| 2019/0373729 A1* | 12/2019 | Park ....................... H05K 1/025 |
| 2020/0022273 A1* | 1/2020 | Han ....................... H05K 3/4007 |
| 2020/0335432 A1* | 10/2020 | Murtagian ........ H01L 21/67144 |
| 2020/0366259 A1* | 11/2020 | Sun .................... H01L 23/49562 |
| 2021/0183754 A1* | 6/2021 | Kim ................... H01L 23/49833 |
| 2021/0325617 A1* | 10/2021 | Zheng .................... H05K 1/144 |
| 2022/0183630 A1* | 6/2022 | Nanaumi ............. A61B 5/7292 |
| 2022/0208646 A1* | 6/2022 | Low ..................... H01L 23/552 |
| 2022/0361334 A1* | 11/2022 | Sun ...................... G06F 1/1658 |
| 2023/0170923 A1* | 6/2023 | Shin .................... H05K 7/20509 |
| | | 455/552.1 |
| 2023/0309226 A1* | 9/2023 | Williams ............... H05K 1/145 |
| 2023/0395967 A1* | 12/2023 | Astorga ............. H01Q 21/0025 |
| 2024/0008167 A1* | 1/2024 | Li .......................... G06F 1/203 |

* cited by examiner

RF POWER PALLET WITH MANAGEMENT DAUGHTER BOARD

BACKGROUND

In the field of radio frequency (RF) amplifiers, a pallet is an amplifier module including one or more semiconductor amplifiers. Many pallets also include one or more input matching networks for impedance matching, phase matching, and other purposes, one more output matching networks, power feeds, input connectors, and output connectors. Pallets are often designed to be mounted on an aluminum or copper heatsink. A number of design concerns are particular to pallets, because of the unique and focused purpose of pallets for RF amplification.

BRIEF DESCRIPTION OF THE DRAWINGS

Aspects of the present disclosure can be better understood with reference to the following drawings. It is noted that the elements in the drawings are not necessarily drawn to scale, with emphasis instead being placed upon illustrating the principles of the examples. In the drawings, like reference numerals designate like or corresponding, but not necessarily the same, elements throughout the several views.

DETAILED DESCRIPTION

Pallet amplifiers are specialized amplifier modules including one or more semiconductor amplifiers for the amplification of radio frequency (RF) signals. Many pallet amplifiers include input matching networks for impedance matching, phase matching, and other purposes, output matching networks, power feeds, input connectors, and output connectors. A number of design concerns are particular to pallet amplifiers, because of the unique and focused purpose of such pallets for RF amplification. For example, some pallet amplifiers are designed for relatively high power, such as output power in the range of 100 to 1000 Watts, and RF input signals at frequency ranges between 2.5 to 3.5 GHz, although the applications for pallet amplifiers is not limited to any particular range of power or frequency.

There is growing demand for RF pallet amplifiers with additional features, including temperature-compensated device biasing for amplifier linearization and other purposes, power sequencing, thermal measurement and shutdown control, power monitoring, interfacing for command and control, and other features. Unfortunately, the design concerns associated with the incorporation of these new features into RF pallets can sometimes conflict with the design concerns associated with the core function of RF power amplification.

In that context, RF power pallets including first circuit boards and second circuit boards are described herein. An example RF power pallet includes a first circuit board comprising a first side, an opposite second side, a first metal layer, and a second metal layer. The power pallet also includes an RF power amplifier coupled to the first metal layer, and a second circuit board positioned over the first circuit board and electrically coupled to the first metal layer. The second circuit board extends the features and capabilities of the RF power pallet, by operating as a daughter board capable of hosting a range of discrete and integrated support circuitry. As just one example, the second circuit board can include a bias voltage driver for the RF power amplifier, and the first metal layer includes a bias voltage trace that extends from a contact of the second circuit board to a gate of the power amplifier. The second circuit board extends the features of the RF pallet, while avoiding some increases in size, cost, and complexity that would typically be associated with the new features.

Figure 1:
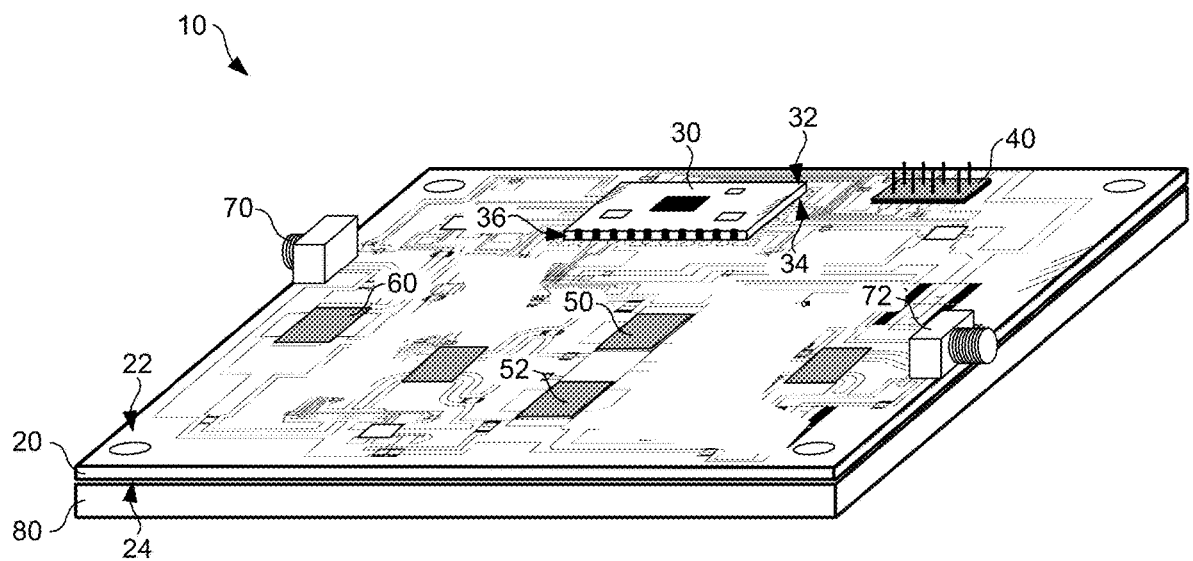
FIG. 1 illustrates an example pallet amplifier according to various examples described herein.

Turning to the drawings, FIG. 1 illustrates an example pallet amplifier 10 according to various examples described herein. Among other components, the pallet amplifier 10 includes a first circuit board 20, a second circuit board 30, an interconnect header 40, power amplifiers 50 and 52, a pre-amplifier 60, an input connector 70, and an output connector 72. The pallet amplifier 10 is mounted to a heat sink 80 in the example shown, using threaded screws, bolts, or other mechanical fasteners. The pallet amplifier 10 is provided as a representative example of an amplifier module designed for the amplification of RF signals. The illustration in FIG. 1 is not exhaustive, and the pallet amplifier 10 can include other components that are not illustrated in FIG. 1. Additionally, one or more components shown in FIG. 1 can be omitted in some cases. The pallet amplifier 10 can be assembled using a range of different parts or components, including one or more printed circuit boards (PCBs), transistors, capacitors, inductors, RF splitters, RF couplers, connectors, integrated circuits, and other components.

A number of design concerns are particular to RF pallets, such as the pallet amplifier 10, because of the unique and focused purpose of pallets for RF amplification. A primary concern for RF pallet design, among others, is linear amplification over a certain range of power and operating frequencies. There are many other design concerns and goals, however, such as module size, cost, amplifier type and class, the field of application, and other concerns. Design engineers often evaluate and individually tailor the metal layers in the PCBs of RF pallets, including the length, width, route, and other aspects of signal traces, power traces, ground layers, and metal features, for preferred performance in view of signal length, parasitic capacitances and inductances, signal coupling, and other relevant concerns. Engineers also consider the overall size, component spacing, component density, heat density, and other factors in the design of PCBs for RF pallets.

At the same time, there is growing demand for RF pallets with additional features, including temperature-compensated device biasing for amplifier linearization and other purposes, power sequencing, thermal measurement and shutdown control, power monitoring, interfacing for command and control, and other features. Unfortunately, the design concerns associated with the incorporation of these new features into RF pallets can sometimes conflict with the design concerns associated with the core function of RF power amplification.

A typical PCB for RF pallets includes a first metal layer on one side of laminate material for power and signal tracing, and a second metal layer on another side of the laminate material that acts as a metal ground layer. This type of two-metal-layer PCB can help to simplify the design concerns related to signal length, parasitic capacitances and inductances, and signal coupling, among other concerns. The performance and electrical characteristics of two-metallayer PCBs can also be simulated more accurately using design tools than PCBs including three or four metal layers. Thus, two-metal-layer PCBs are often preferred for use in RF pallets, as PCBs with more than two metal layers can exhibit undesirable performance, are difficult to design and simulate, are costly, and lead to other compromises. However, two-metal-layer PCBs are also limiting for the incorporation of new features, which often require a significant number of low-power signal traces, digital and analog control circuitry, and other components.

The pallet amplifier 10 provides a novel approach to help balance competing concerns in the design of RF pallets, particularly as the demand for new RF pallets with additional features grows. According to a number of aspects of the embodiments described herein, the second circuit board 30 of the pallet amplifier 10 facilitates the extension of many new features for the pallet amplifier 10, while at the same time avoiding some increases in size, cost, and complexity that would typically be associated with the addition of those new features to the pallet amplifier 10. The second circuit board 30 is a type of daughter board for the first circuit board 20, and it extends the features of the pallet amplifier 10.

Among other benefits of the second circuit board 30, many of the discrete and integrated circuit components that facilitate the new and advanced features of the pallet amplifier 10 can be mounted to and interconnected among each other on the second circuit board 30. Many of those interconnections do not traverse the metal layers of the first circuit board 20, simplifying the design of the metal layers of the first circuit board 20. The second circuit board 30 can also be embodied as a circuit board of more than two metal layers, to facilitate a greater number of interconnections in a smaller footprint. At the same time, the second circuit board 30 can be manufactured using less expensive laminate materials and manufacturing tools.

According to aspects of the embodiments, a selective number of interconnections can be established between the second circuit board 30 and the first circuit board 20, without unduly complicating the signal length, signal coupling, parasitic, and other design concerns of the first circuit board 20. The second circuit board 30 can be manufactured and procured separately from the first circuit board 20. The second circuit board 30 can also be replaced relatively easily to update or alter the features of the pallet amplifier 10, and the second circuit board 30 also offers additional benefits described herein.

The components of the pallet amplifier 10 are described in greater detail before turning to additional benefits of the embodiments. The circuit board 20 can be embodied as a two-metal-layer PCB formed from a core material suitable for use in RF pallets, including laminate materials. The laminate material can be selected for characteristics suitable for the implementation of RF power amplifiers. Example applications for the pallet amplifier 10 include the power amplification of RF input signals with output power in the range of 100 to 1000 Watts, at frequency ranges between 2.5 to 3.5 GHz, although other power levels and frequency ranges are within the scope of the embodiments.

Among other characteristics, the laminate material of the circuit board 20 can have a dielectric coefficient suitable for high operating frequencies, a low temperature coefficient of dielectric constant, a stable dielectric constant over a wide frequency range, a thermal coefficient of expansion similar to that of copper, and other preferred characteristics. Example materials include ROGERS® 3450, 6010, 4003C, 4350B, or 4450B core materials, although others can be relied upon. A suitable thickness of the core material can range from between 5 and 40 mils (i.e., thousandths of an inch), although other thicknesses can be relied upon.

The core material of the circuit board 20 includes a first side 22 or surface (also "top" side or surface) and an opposite second side 24 or surface (also "bottom" side or surface). In one example, the circuit board 20 also includes a first metal layer on the first side 22 and a second metal layer on the second side 24 of the core material. The first or top metal layer is segmented or divided into a number of electrically-separated metal traces, for the interconnection of certain components of the pallet amplifier 10 as described herein.

The second or bottom metal layer is relied upon as a ground plane of the pallet amplifier 10. The second metal layer can extend over a significant region of the second side 24 of the core material. In some cases, the second metal layer can extend between the peripheral edges of the circuit board 20. A thermally-conductive electrical insulator can be inserted between the second side 24 of the pallet amplifier 10 and the heat sink 80 in some cases, or the second metal layer can electrically contact the heat sink 80 in other cases. While the circuit board 20 can include only two metal layers in some cases, the circuit board 20 can include additional metal layers, such as three, four, or more metal layers.

The second circuit board 30 can be embodied as a multi-layer PCB formed from a core material suitable for digital and analog control circuitry, including laminate materials. The core material of the circuit board 30 can be different than the core material of the circuit board 20, because the circuit board 30 is not relied upon for the amplification of RF signals in frequency ranges between 2.5 to 3.5 GHz. Instead, the circuit board 30 can be relied upon to interconnect a range of low-voltage digital and analog control circuitry, local interfaces, digital-to-analog and analog-to-digital converters, and other control circuitry, in a combination of discrete and integrated formats. Examples of the types of control circuitry that can be mounted and interconnected on the circuit board 30 are described in further detail below with reference to FIG. 2. In one example, the core material of the circuit board 30 can be a fiberglass-reinforced epoxy laminate material, such as FR4 or similar laminate core material. Among other differences, the second circuit board 30 can include a core material having a dielectric coefficient different than the dielectric coefficient of the circuit board 20.

The core material of the circuit board 30 includes a first side 32 or surface (also "top" side or surface) and a second side 34 or surface (also "bottom" side or surface). In one example, the circuit board 30 also includes a first metal layer on the first side 32, second and third internal metal layers that are isolated from each other within the laminate stack of the core material of the circuit board 30, and a fourth metal layer on the second side 34 of the core material. Similar to the circuit board 20, the metal layer on the second side 34 of the core material can be primarily used as a ground layer.

In one example, the circuit board 30 can include one or more castellations or castellated edge contacts 36 extending around the periphery of the circuit board 30. The castellated edge contacts 36 can extend along one, two, three, or four of the peripheral edges of the circuit board 30. The castellated edge contacts 36 can be relied upon as contacts for electrical interconnections to the circuit board 20. In one example, the top metal layer of the circuit board 20 can include a number of trace pads positioned for electrical coupling with the castellated edge contacts 36 of the circuit board 30. As examples, the top metal layer of the circuit board 20 can include traces for power sequencing, power amplifier gate biasing, and temperature sensing, and these traces can be routed to pads for electrical coupling to the castellated edge contacts 36 of the circuit board 30. The total number of traces in the top metal layer of the circuit board 20 that are routed to the circuit board 30 can be significantly less than the total number of traces or interconnections on the circuit board 30 to support the power sequencing, gate biasing, and temperature sensing features, which helps to simplify the circuit board 20. Examples of the traces and pads of the circuit board 20 are described below with reference to FIGS. 3 and 4.

In one embodiment, the circuit board 30 is positioned over circuit board 20. In this case, the castellated edge contacts 36 physically contact the circuit board 20 and are soldered or coupled to the pads of the circuit board 20. The circuit board 20 can also include features under the circuit board 30, to help spread heat away from circuitry on the circuit board 30 and provide other benefits. In the example shown, the major sides 22 and 24 of the circuit board 20 extend parallel to the major sides 32 and 34 of the circuit board 30. The circuit board 30 can also be positioned at the bottom side of the circuit board 20. In that case, the heat sink 80 can include an opening or cavity under the circuit board 20, where the circuit board 30 is mounted and coupled to the bottom of the circuit board 20. The pallet amplifier 10 can also include other types of interconnections between the circuit board 20 and the circuit board 30. For example, the circuit board 30 can be coupled to the circuit board 20 through pins, sockets, or other interconnects.

The interconnect header 40 can be embodied as header with a number of pins, connectors, or other contacts for electrical connection of the pallet amplifier 10 to a ground reference, power for the power amplifiers 50 and 52, power for the control circuitry on the circuit board 30, a local interface, and alarms and other command and control signaling. Among the embodiments, any suitable interconnect header, socket, or connector can be relied upon.

The power amplifiers 50 and 52 can be embodied as high power, group III-V active semiconductor devices, such as power transistors formed from gallium nitride materials, including gallium nitride (GaN) on a silicon carbide (SiC) substrate in one example. The power amplifiers 50 and 52 can be embodied as other types of power transistors, including GaN on a silicon (Si) substrate and other group III-V active semiconductor devices. The sizes of the power amplifiers 50 and 52 can be selected for the desired power handling capability of the pallet amplifier 10. The power amplifiers 50 and 52 are relied upon in the final push/pull amplification stage of the pallet amplifier 10, and other arrangements of power amplifiers can be relied upon, including single stage amplifiers. Thus, in some cases, one of the power amplifiers 50 and 52 can be omitted.

The pre-amplifier 60 can also be embodied as a group III-V active semiconductor device, such as a power transistor formed from gallium nitride or other materials. The size of the pre-amplifier 60 can be selected for the desired power handling capability of the pallet amplifier 10, taken in series with the power amplifiers 50 and 52. Other arrangements of power amplifiers can be relied upon, and the pre-amplifier 60 can be omitted in some cases. The input connector 70 and the output connector 72 can be embodied as any suitable types of RF connectors, such as SMA, N, BNC, or other female or male RF connectors.

The power amplifiers 50, 52, and 60 can be embodied as depletion mode power transistors, although other types of transistors can be relied upon. GaN and other types of depletion mode transistor semiconductor devices can rely upon a sequenced application of gate and drain voltage potentials, during operation, to avoid failure modes. According to the embodiments described herein, this biasing circuitry can be supported on the second circuit board 30. As opposed to implementing the biasing circuitry on the first circuit board 20, the second circuit board 30 offers better noise immunity for the biasing circuitry, which can help to avoid failure modes, among other benefits. In operation, power is provided to the pallet amplifier 10 at the interconnect header 40. In one example, a 50V power source can be provided at the interconnect header 40 for the power amplifiers 50 and 52, along with a low voltage 5V power supply for the circuitry on the second board 30. An input signal for amplification is provided at the input connector 70. The input signal is first amplified by the pre-amplifier 60 and further amplified by the power amplifiers 50 and 52. An output of the power amplifiers 50 and 52 is provided at the output connector 72.

The overall operation of the pallet amplifier 10 is facilitated by the control circuitry mounted on the circuit board 30. For example, the circuitry on the circuit board 30 can be relied upon for temperature-compensated device biasing for linearization of the power amplifiers 50 and 52. The circuitry can also be relied upon for power sequencing of the pre-amplifier 60 and the power amplifiers 50 and 52. The circuitry can also provide support for thermal measurement and shutdown control, power monitoring, interfacing for command and control, and other features described below. To the extent possible, these and other features of the pallet amplifier 10 are supported by circuitry mounted to the circuit board 30 rather than mounted to the circuit board 20, simplifying the layout of the top metal layer of the circuit board 20. The incorporation of the control circuitry using the circuit board 30 facilitates simplicity for the circuit board 20. Without the use of the circuit board 30, it could be necessary to rely upon additional metal layers in the circuit board 20, increasing the cost of the circuit board 20. Alternatively, it may not be possible to incorporate as many supporting control circuitry features into the pallet amplifier 10 without the use of the circuit board 30.

Figure 2:
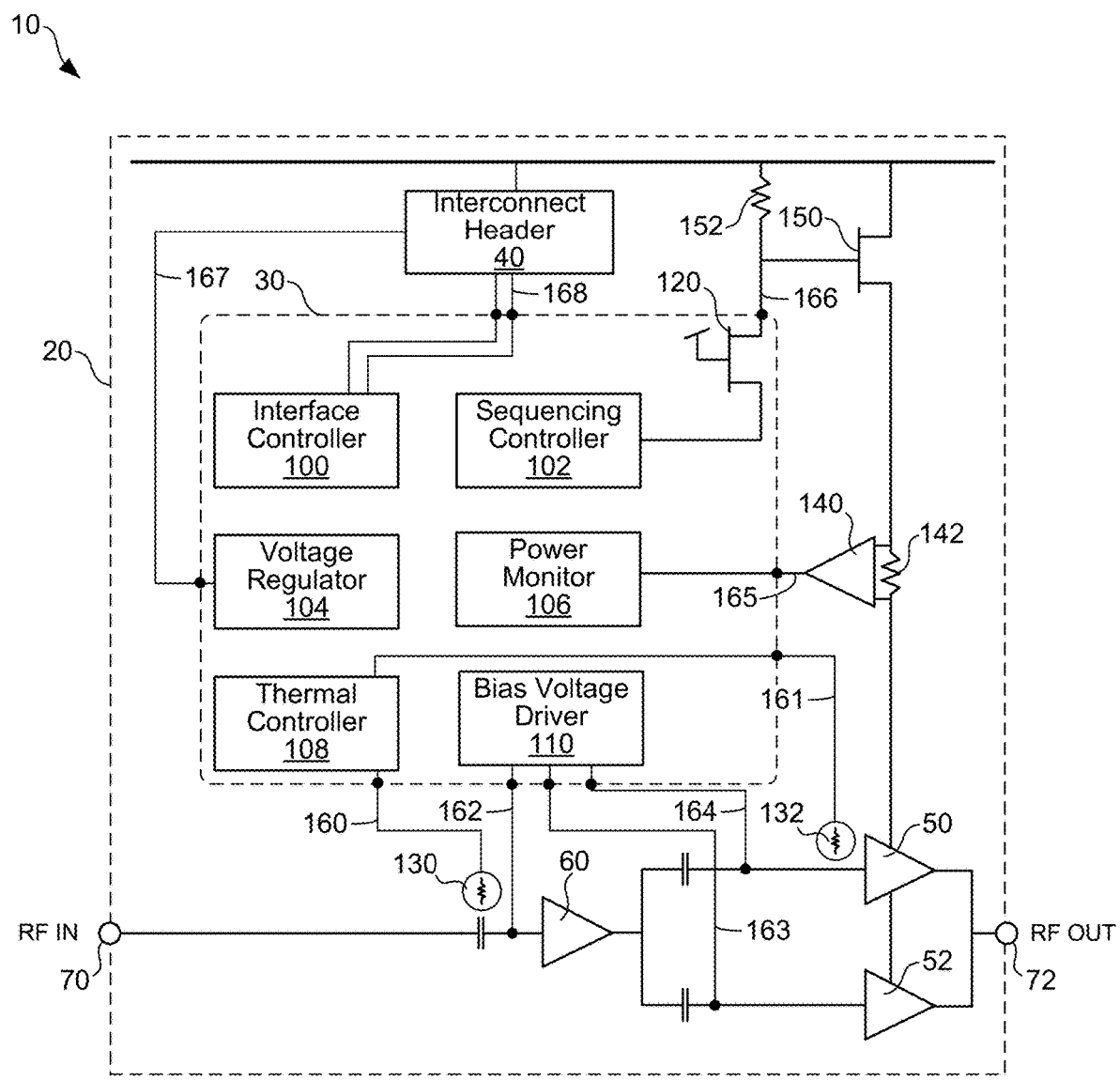
FIG. 2 illustrates an example block diagram of the components of the pallet amplifier shown in FIG. 1 according to various examples described herein.

FIG. 2 illustrates an example block diagram of the components of the pallet amplifier 10 shown in FIG. 1. FIG. 2 is provided as a representative example of the types of components of the pallet amplifier 10, including those supported by the circuit board 20 and by the circuit board 30, respectively. The illustration in FIG. 2 is not exhaustive, and the pallet amplifier 10 can include other components that are not illustrated in FIG. 2, such as RF couplers and splitters, input matching networks for impedance matching, phase matching, and other purposes, output matching networks, impedance inverters, power feeds, and other components. Additionally, one or more components shown in FIG. 2 can be omitted in some cases. For example, FIG. 2 illustrates a multi-stage amplifier including the pre-amplifier 60 and the power amplifiers 50 and 52. However, the concepts described herein are not limited to use with any particular topology or type of power amplifier. The concepts can be extended to use with power amplifiers that include fewer or greater amplifier devices.

As shown in FIG. 2, the circuit board 30 includes an interface controller 100, a sequencing controller 102, a voltage regulator 104, a power monitor 106, a thermal controller 108, a bias voltage driver 110, and a pull down switch 120, among possibly other components. The circuit board 20 also includes a temperature sensor 130, a temperature sensor 132, a current sense amplifier 140, a power pass transistor 150, and a number of traces that extend between the circuit board 30 and components on the circuit board 20. Among possibly others, the traces from the circuit board 30 include temperature sense feedback traces 160 and 161, bias voltage traces 162, 163, and 164, a current sense feedback trace 165, a power control trace 166, a low voltage power trace 167, and one or more local interface traces 168. Although they are not separately illustrated in FIG. 2, the circuit board 30 includes a number of traces and interconnects among the controllers, regulators, monitors, and drivers that are mounted to the circuit board 30. The metal layers of the circuit board 30, which can include two, three, four, or more metal layers, can include a significant number of traces and, in some cases, many more traces than the top metal layer of the circuit board 20.

The components on the circuit board 20 can be embodied as a mix of integrated and discrete circuit components. For example, the sequencing controller 102, the power monitor 106, the thermal controller 108, and the bias voltage driver 110 can be integrated together on a single semiconductor die, packaged together, and mounted and electrically coupled to the circuit board 20 in a single package. The same components can be individually packaged and coupled to the circuit board 20 in other cases. For example, the interface controller 100, the voltage regulator 104, or both can be embodied as separate discrete or integrated circuit components coupled separately to the circuit board 20. The pull down switch 120 can be embodied as a discrete transistor on the circuit board 20. The components of the circuit board 30, as shown in FIG. 2, are provided as an example. One or more of the components, such as the thermal controller 108, the voltage regulator 104, the pull down switch 120, or other components can be omitted in certain cases. Additionally, other components that are not shown on the circuit board 30 can be added. For example, in some cases, the current sense amplifier 140 can be mounted on the circuit board 30 rather than on the circuit board 20.

The bias voltage driver 110 can include a number of temperature-controlled digital-to-analog (DAC) converters capable of providing gate bias voltages over a range, such as a negative output range from 0V to −6V in one example, although positive and other voltage ranges can be implemented. The gate bias voltages can be relied upon to bias the operating states of the pre-amplifier 60, the power amplifier 50, and the power amplifier 52. The gate bias voltages can be temperature-compensated bias voltages in one example. In that context, the bias voltages can be adjusted based on operating temperature data collected and stored by the thermal controller 108, to help linearize the pre-amplifier 60, the power amplifier 50, and the power amplifier 52 over a wide range of operating temperatures, frequencies, and power.

The supply of power or current for gate biasing can also be dynamically controlled by the driver 110 over the operating range of the amplifiers 50, 52, and 60. For example, the driver 110 can provide an increased supply of current as the amplifiers 50 and 52 are respectively driven into compression, and the driver 110 can also incorporate a programmable threshold shut-off point. The threshold shut-off point can prevent the amplifiers 50 and 52 from overdrive conditions leading to device failure. The biases generated by the bias voltage driver 110 can be coupled from contacts on the circuit board 30 (e.g., from one or more of the castellated edge contacts 36 shown in FIG. 1) to the bias voltage traces 162, 163, and 164 on the circuit board 30. As shown in FIG. 2, the bias voltage trace 162 is routed to the gate terminal of the pre-amplifier 60. Similarly, the bias voltage trace 163 is routed to the gate terminal of the amplifier 52, and the bias voltage trace 164 is routed to the gate terminal of the amplifier 50. The circuit board 20 can include fewer or additional bias voltage traces in other cases.

The thermal controller 108 can include a number of analog-to-digital (ADC) converters capable of measuring analog feedback signals from the temperature sensors 130 and 132. The temperature sensors 130 and 132 can be embodied as temperature-variable resistances or thermistors, for example, and the thermal controller 108 can convert feedback signals received from the temperature sensors 130 and 132 into data for further processing by the bias voltage driver 110 or other control components. The feedback signals can be coupled between contacts on the circuit board 30 (e.g., from one or more of the castellated edge contacts 36 shown in FIG. 1) to temperature sensors 130 and 132 on the circuit board 30. As shown in FIG. 2, the temperature sense feedback trace 160 is routed to the temperature sensor 130. Similarly, the temperature sense feedback trace 161 is routed to the temperature sensor 132.

The interface controller 100 can be embodied as a local interface or local interface controller for command and control of the other controllers, regulators, monitors, and drivers on the circuit board 30. The interface controller 100 can include a serial, parallel, synchronous, asynchronous, or other local interface. In one example, the interface controller 100 can be embodied as an inter-integrated circuit or I2C bus. The interface controller 100 can thus operate a synchronous, multi-target, single-ended, serial communication bus between the circuit board 30 and the interconnect header 40 of the circuit board 20. The local interface can be coupled between contacts on the circuit board 30 (e.g., from one or more of the castellated edge contacts 36 shown in FIG. 1) to the interconnect header 40 on the circuit board 30. As shown in FIG. 2, the one or more local interface traces 168 are routed between the contacts on the circuit board 30 and the interconnect header 40.

The voltage regulator 104 can be embodied as a regulator capable of stepping down a higher voltage on the circuit board 30 to a lower voltage on the circuit board 30. For example, the low voltage power trace 167 can provide a power supply of 5V from the interconnect header 40 to one or more contacts on the circuit board 30, for routing to various circuit components on the circuit board 30. In some cases, however, certain components on the circuit board 30 may require a different voltage for operation. For example, the interface controller 100 may require a lower voltage than that provided through the interconnect header 40. Thus, the voltage regulator 104 can step down the voltage from the interconnect header 42 a suitable operating voltage for the interface controller 100. As one example, the voltage regulator 104 can step down the 5V voltage to 3-3.6V, for use by the interface controller 100 in signaling on the I2C interface.

The voltage regulator 104 can also convert the 5V power supply from the interconnect header 40 into a negative voltage, which can be relied upon for gate biasing for certain devices and other purposes. The voltage regulator 104 can convert the 5V power supply into one or more negative voltages, such as negative voltages in a range from −1 to −6V, or a wider range, and provide the negative voltages to the bias voltage driver 110. Thus, the circuit board 20 can also include circuitry that simplifies the interconnect header 40, as it is unnecessary for the interconnect header 40 to include respective pins or contacts for both positive and negative voltages, if negative bias voltages are needed for operation of the amplifiers 50, 52, and 60.

The sequencing controller 102 can be embodied as control circuitry capable of sequencing power to a number of components on the power amplifier 10 in a certain sequence. For example, the sequencing controller 102 can first direct the power up of certain components on the circuit board 30, such as the power monitor 106, the thermal controller 108, and the bias voltage driver 110, before controlling the supply of power to the amplifiers 50 and 52 and the pre-amplifier 60 through control of the power pass transistor 150. In that way, suitable bias voltages can be established at the gates of the amplifiers 50, 52, and 60 before power is sourced to the drains of the amplifiers 50, 52, and 60.

In the configuration shown, the pull up resistor 152 is coupled between the high voltage power rail of the pallet amplifier 10 and the gate of the power pass transistor 150. The high voltage power rail can be supplied with power at a relatively high voltage of 50V, for example. Thus, a high potential is provided at the gate of the power pass transistor 150, until the pulldown switch 120 is activated by the sequencing controller 102. The power pass transistor 150 will not pass current from the high voltage power rail to the amplifiers 50, 52, and 60 of the pallet amplifier 10 until the voltage at the gate of the power pass transistor 150 is pulled down by the pulldown switch 120. After the sequencing controller 102 has confirmed the operating status of the control circuitry on the circuit board 30, the sequencing controller 102 can activate the pulldown switch 120, leading to a reduced voltage at the gate of the power pass transistor 150. The power pass transistor 150 will turn on with the reduced voltage, to supply power from the high voltage power rail to the amplifiers 50, 52, and 60. For that purpose, the power control trace 166 can be coupled between contacts on the circuit board 30 (e.g., from one or more of the castellated edge contacts 36 shown in FIG. 1) to the gate of the power pass transistor 150.

Power supplied from the high voltage power rail to the amplifiers 50, 52, and 60 can pass through the current sense resistor 142. The current sense amplifier 140 can measure the voltage drop across the current sense resistor 142, which is an indicator of the amount of current being drawn by the amplifiers 50 and 52. The current sense amplifier 140 outputs a current sense feedback signal based on the voltage drop across the current sense resistor 142, which is provided to the power monitor 106 over the current sense feedback trace 165. The power monitor 106 can monitor the feedback signal from the current sense amplifier 140, to determine operating conditions of the power amplifiers 50 and 52. The power monitor 106 can also direct or inform other circuitry on the circuit board 30 based on the amount of current being drawn by the amplifiers 50 and 52.

The discrete and integrated circuitry on the circuit board 30 enable a significant number of features and functions for the power amplifier 10 that could not easily be implemented directly on the circuit board 20. As described above, the integrated circuitry provides high side power sequencing control, power amplifier current sense feedback control, temperature-compensated bias voltage drivers, onboard thermal shutdown control, low voltage regulation for data communications, and other features. The integrated circuitry can also provide power supply monitoring, temperature supervision, thermal shutdown sequencing, and other features. The discrete and integrated circuitry on the circuit board 30 also includes memory, which can be programmed to control sequencing, linearization, thermal shutdown conditions, power monitoring conditions, and other operating characteristics for the power amplifier 10. The power amplifier 10 can operate autonomously, without further intervention, based on the programmed control provided by the circuit board 30, extending the capabilities of the power amplifier 10. Additionally, the interface controller 100 permits control and monitoring of the gate voltage bias drivers, the gate currents, temperatures, current draw, and other operating characteristics of the power amplifier 10.

The discrete and integrated circuit components that facilitate these advanced features of the pallet amplifier 10 are mounted to and interconnected among each other on the circuit board 30. Many of those interconnections do not traverse the metal layers of the circuit board 20, simplifying the design of the metal layers of the circuit board 20. The circuit board 30 can also be embodied as a circuit board of more than two metal layers, to facilitate a greater number of interconnections in a smaller footprint. The circuit board 30 also can be manufactured using less expensive laminate materials and manufacturing tools as compared to the circuit board 20. Additionally, a more selective number of interconnections can be established between the circuit board 30 and the circuit board 20, without unduly complicating the signal length, signal coupling, parasitic, and other design concerns of the circuit board 20.

Figure 3:
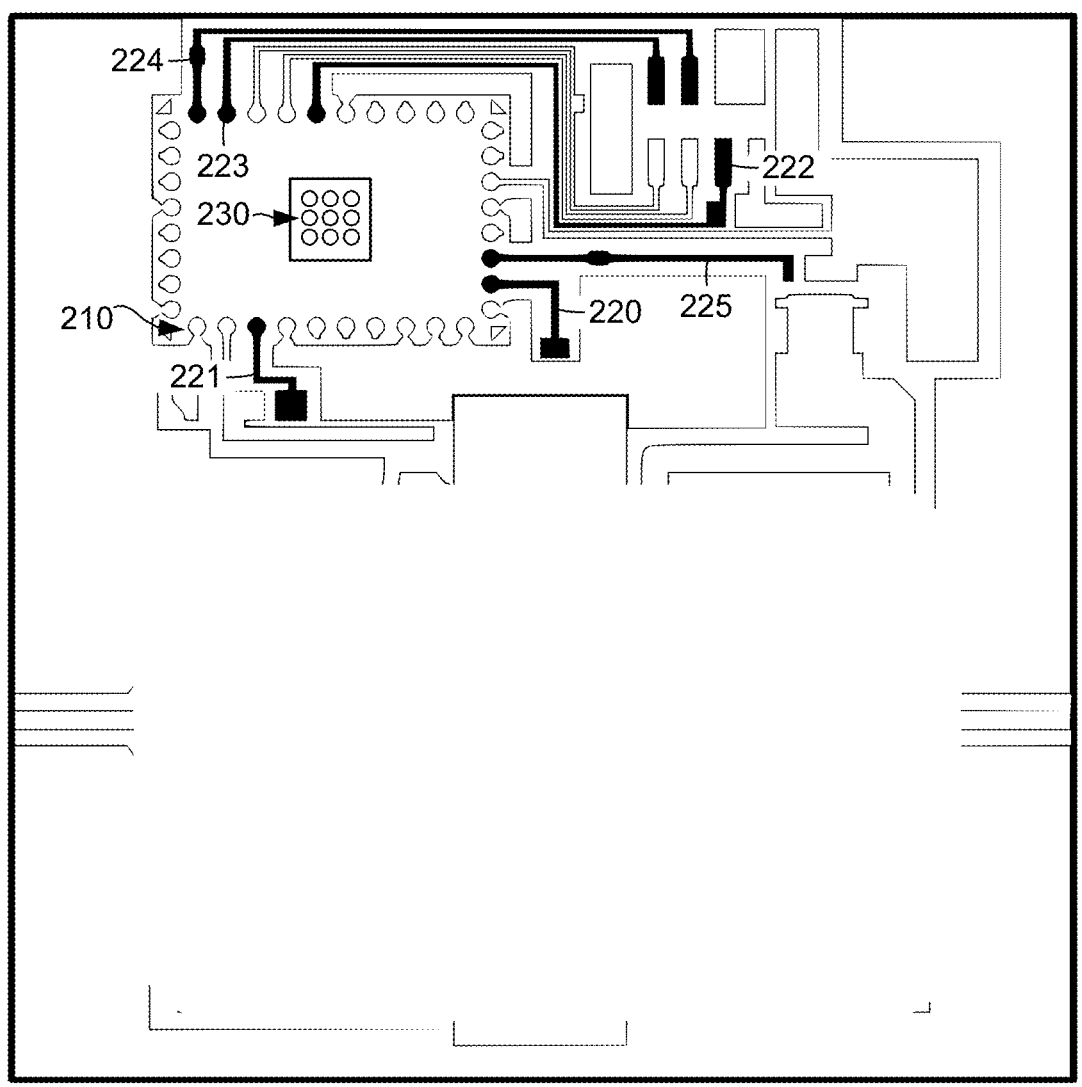
FIG. 3 illustrates an example layout for a metal layer of a pallet amplifier according to the concepts described herein.

FIG. 3 illustrates an example layout of a metal layer 200 for a pallet amplifier according to the concepts described herein. The metal layer 200 is provided as an example, and many of the traces of the metal layer 200 are intentionally omitted or obscured to focus on the concepts described herein. The metal layer 200 can be used in the main circuit board of a pallet amplifier, similar to the top metal layer in the circuit board 20 shown in FIGS. 1 and 2. The metal layer 200 includes a plurality of metal traces capable of electrically interconnecting power amplifiers, power pass transistors, matching networks for impedance matching, phase matching, and other purposes, output matching networks, power feeds, input connectors, and output connectors, and other components of pallet amplifiers.

A number of traces of the metal layer 200 terminate or end in pads for interconnection with a daughter board, such as the circuit board 30 described above. One row of such pads 210 is identified in FIG. 3, and the metal layer 200 includes four rows of pads that extend in a rectangular shape for interconnection with a daughter board. The daughter board can include castellated edge contacts extending around its periphery, for electrical interconnection with the row of pads 210, among others.

Traces of the metal layer 200 extend from the row of pads 210, among other pads, for connection to other components. For example, the metal layer 200 includes a temperature sense feedback trace 220, a gate bias voltage trace 221, a low voltage power trace 222, local interface traces 223 and 224, and a power control trace 225. The traces 220-225 provide interconnects between a daughter board and a main circuit board of a pallet amplifier, similar to the traces described above with reference to FIG. 2. The layout of the metal layer 200 also includes accounts for a via matrix 230 positioned between rows of pads 210. The via matrix 230 can help to dissipate heat from integrated circuits on the daughter board, provide an electrical ground in some cases, or serve other purposes.

Figure 4:
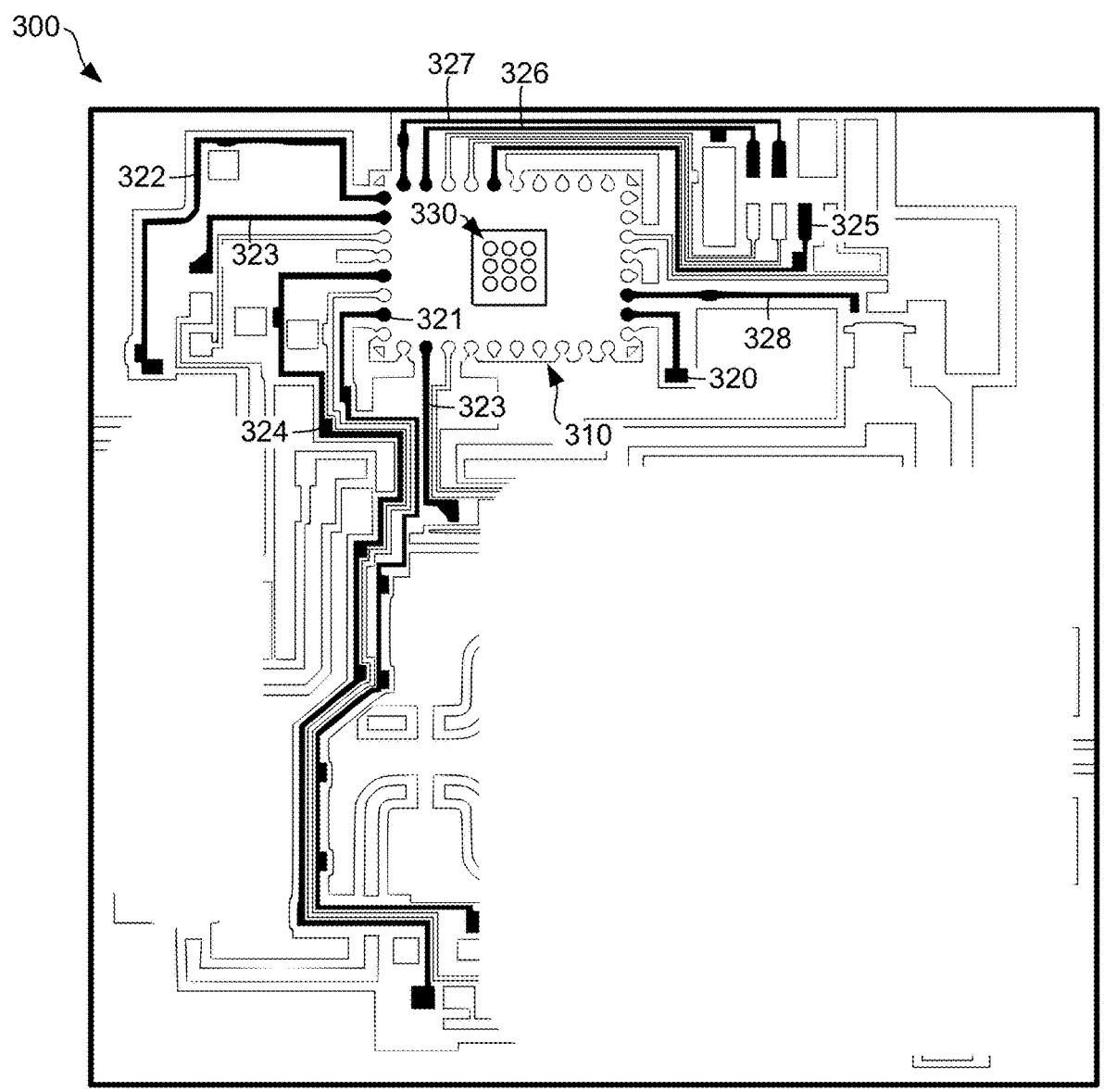
FIG. 4 illustrates an example layout for a metal layer of another pallet amplifier according to the concepts described herein.

FIG. 4 illustrates an example layout for a metal layer 300 of another pallet amplifier according to the concepts described herein. The metal layer 300 is provided as an example, and many of the traces of the metal layer 200 are intentionally omitted or obscured to focus on the concepts described herein. The metal layer 300 can be used in the main circuit board of a pallet amplifier, similar to the top metal layer in the circuit board 20 shown in FIGS. 1 and 2. The metal layer 300 includes a plurality of metal traces capable of electrically interconnecting power amplifiers, power pass transistors, matching networks for impedance matching, phase matching, and other purposes, output matching networks, power feeds, input connectors, and output connectors, and other components of pallet amplifiers.

A number of traces of the metal layer 300 terminate or end in pads for interconnection with a daughter board, such as the circuit board 30 described above. One row of such pads 310 is identified in FIG. 4, and the metal layer 300 includes four rows of pads that extend in a rectangular shape for interconnection with a daughter board. The daughter board can include castellated edge contacts extending around its periphery, for electrical interconnection with the row of pads 310, among others.

Traces of the metal layer 300 extend from the row of pads 310, among other pads, for connection to other components. For example, the metal layer 300 includes a temperature sense feedback traces 320-322, gate bias voltage traces 323 and 324, a low voltage power trace 325, local interface traces 326 and 327, and a power control trace 328. The traces 320-328 provide interconnects between a daughter board and a main circuit board of a pallet amplifier, similar to the traces described above with reference to FIG. 2. The layout of the metal layer 300 also includes accounts for a via matrix 330 positioned between rows of pads 310. The via matrix 330 can help to dissipate heat from integrated circuits on the daughter board, provide an electrical ground in some cases, or serve other purposes.

The transistors in the power amplifiers 50, 52, and 60 can be formed from group III-V elemental semiconductor materials, including the III-Nitrides (Aluminum (Al), Gallium (Ga), Indium (In), and their alloys (AlGaIn) based Nitrides), Gallium Arsenide (GaAs), Indium Phosphide (InP), Indium Gallium Phosphide (InGaP), Aluminum Gallium Arsenide (AlGaAs), and compounds thereof. In other cases, the transistors in the amplifiers 50, 52, and 60 can be formed from group IV elemental semiconductor materials, including Silicon (Si), Germanium (Ge), and compounds thereof.

The power amplifiers 50, 52, and 60 can be embodied in gallium nitride materials formed over a Si substrate, a SiC substate, or another suitable substrate. Thus, the power amplifiers 50, 52, and 60 can be embodied as power transistors formed in gallium nitride materials. The concepts described herein are not limited to the use of any particular types of substrates or semiconductor materials, however, and can be extended to use with many different types of semiconductor materials.

The power amplifiers 50, 52, and 60 can be embodied as field effect transistors (FETs). In some cases, the power amplifiers 50, 52, and 60 can include one or more field plates, such as source-connected field plates, gate-connected field plates, or both source-connected and gate-connected field plates. Although FET transistors are described above, the concepts described herein can be applied to bipolar junction transistors, and the amplifiers described herein can be embodied using bipolar junction and other types of transistors. Among other types of FET transistors, the power amplifiers 50, 52, and 60 described herein can be formed as high electron mobility transistors (HEMTs), pseudomorphic high-electron mobility transistors (pHEMTs), metamorphic high-electron mobility transistors (mHEMTs), and laterally diffused metal oxide semiconductor transistors (LDMOS) for use as high efficiency power amplifiers.

The power transistors described herein can be formed using a number of different semiconductor materials and semiconductor manufacturing processes. Example semiconductor materials include the group IV elemental semiconductor materials, including Si and Germanium (Ge), compounds thereof, and the group III elemental semiconductor materials, including Aluminum (Al), Gallium (Ga), and Indium (In), and compounds thereof. Semiconductor transistor amplifiers can be constructed from group III-V direct bandgap semiconductor technologies, in certain cases, as the higher bandgaps and electron mobility provided by those devices can lead to higher electron velocity and breakdown voltages, among other benefits. Thus, in some examples, the concepts can be applied to group III-V direct bandgap active semiconductor devices, such as the III-Nitrides (Aluminum (Al)—, Gallium (Ga)—, Indium (In)—, and their alloys (AlGaIn) based Nitrides), GaAs, InP, InGaP, AlGaAs, etc. devices. However, the concepts can also be applied to transistors and other active devices formed from other semiconductor materials.

The power transistors be embodied as GaN-on-Si transistors, GaN-on-SiC transistors, as well as other types of semiconductor devices. As used herein, the phrase "gallium nitride material" or GaN material refers to gallium nitride and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), among others. Typically, when present, arsenic and/or phosphorous are at low concentrations (e.g., less than 5 weight percent). The term "gallium nitride" or GaN refers directly to gallium nitride, exclusive of its alloys.

The features, structures, and components described above may be combined in one or more embodiments in any suitable manner, and the features discussed in the various embodiments are interchangeable, where technically suitable. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although relative terms such as "on," "below," "upper," "lower," "top," "bottom," "right," and "left" may be used to describe the relative spatial relationships of certain structural features, these terms are used for convenience only, as a direction in the examples. It should be understood that if the device is turned upside down, the "upper" component will become a "lower" component. When a structure or feature is described as being "over" (or formed over) another structure or feature, the structure can be positioned over the other structure, with or without other structures or features intervening between them. When two components are described as being "coupled to" each other, the components can be electrically coupled to each other, with or without other components being electrically coupled and intervening between them. When two components are described as being "directly coupled to" each other, the components can be electrically coupled to each other, without other components being electrically coupled between them.

Terms such as "a," "an," "the," and "said" are used to indicate the presence of one or more elements and components. The terms "comprise," "include," "have," "contain," and their variants are used to be open ended and may include Therefore, the following is claimed:

1. A radio frequency (RF) power pallet, comprising:
a first circuit board comprising a first side, a second side, a first metal layer, and a second metal layer;
an RF power amplifier electrically coupled to the first metal layer of the first circuit board; and
a second circuit board positioned over the first side of the first circuit board and electrically coupled to the first metal layer, the second circuit board comprising a bias voltage driver for a gate of the RF power amplifier, wherein:
the first circuit board comprises a first core material and the second circuit board comprises a second core material different than the first core material; and
the first metal layer of the first circuit board comprises a bias voltage trace that extends from the bias voltage driver and a contact of the second circuit board to the gate of the RF power amplifier.

2. The RF power pallet according to claim 1, wherein the second circuit board comprises castellated edge contacts.

3. The RF power pallet according to claim 1, wherein the second circuit board comprises a core of FR4 material and the first circuit board comprises a core of material having a dielectric constant different than the dielectric constant of the FR4 material.

4. The RF power pallet according to claim 1, wherein:
the second circuit board comprises a power sequencing controller; and
the first metal layer further comprises a power control trace that extends from a contact of the second circuit board to a power pass transistor on the first circuit board.

5. The RF power pallet according to claim 1, wherein:
the second circuit board comprises a current sense feedback controller for the RF power amplifier; and
the first metal layer further comprises a current sense feedback trace that extends from a contact of the second circuit board to a current sense component on the first circuit board.

6. The RF power pallet according to claim 1, wherein:
the bias voltage driver comprises a temperature-compensated bias voltage driver; and
the first metal layer further comprises a temperature sense feedback trace that extends from a contact of the second circuit board to a temperature sense component on the first circuit board.

7. The RF power pallet according to claim 1, wherein the second circuit board comprises a low voltage regulator to supply power for data control communications.

8. The RF power pallet according to claim 1, wherein the first metal layer further comprises a local interface trace that extends from a contact of the second circuit board to an interconnect header on the first circuit board.

9. The RF power pallet according to claim 1, wherein:
the second circuit board comprises a plurality of discrete and integrated components mounted on the second circuit board;
the second circuit board comprises at least three metal layers for electrical interconnection of the plurality of discrete and integrated components; and
metal layers of the first circuit board consist of the first metal layer and the second metal layer.

10. The RF power pallet according to claim 1, wherein the first circuit board comprises a via matrix positioned between rows of pads for interconnect with the second circuit board.

11. The RF power pallet according to claim 1, wherein the RF power amplifier comprises gallium nitride materials.

12. A radio frequency (RF) power pallet, comprising:
a first circuit board comprising a first metal layer and a second metal layer;
an RF power amplifier electrically coupled to the first metal layer of the first circuit board; and
a second circuit board electrically coupled to the first metal layer, the second circuit board comprising a power sequencing controller for the RF power amplifier, wherein:
the first metal layer comprises a power control trace that extends from a contact of the second circuit board to a power pass transistor on the first circuit board.

13. The RF power pallet according to claim 12, wherein the second circuit board comprises a core of FR4 material and the first circuit board comprises a core of material having a dielectric constant different than the dielectric constant of the FR4 material.

14. The RF power pallet according to claim 12, wherein the first metal layer further comprises a bias voltage trace that extends from a second contact of the second circuit board to a gate of the RF power amplifier.

15. The RF power pallet according to claim 14, wherein the power sequencing controller of the second circuit board is capable of sequencing control and bias signals on the power control trace and the bias voltage trace of the first circuit board for operation of the RF power amplifier.

16. The RF power pallet according to claim 12, wherein:
the second circuit board comprises a current sense feedback controller for the RF power amplifier; and
the first metal layer further comprises a current sense feedback trace that extends from a contact of the second circuit board to a current sense component on the first circuit board.

17. A radio frequency (RF) power pallet, comprising:
a first circuit board comprising a first metal layer and a second metal layer; and
an RF power amplifier electrically coupled to the first metal layer of the first circuit board, wherein the first metal layer comprises:
a row of pads for interconnect with a second circuit board;
a power control trace that extends from the row of pads to a power pass transistor on the first circuit board; and
a bias voltage trace that extends from the row of pads to a gate of the RF power amplifier.

18. The RF power pallet according to claim 17, wherein the first metal layer further comprises a current sense feedback trace that extends from the row of pads to a current sense component on the first circuit board.

19. The RF power pallet according to claim 17, wherein the first metal layer further comprises a local interface trace that extends from the row of pads to an interconnect header on the first circuit board.

20. The RF power pallet according to claim 17, further comprising the second circuit board positioned over a first side of the first circuit board and electrically coupled to the first metal layer.

* * * * *